United States Patent
Matsuda et al.

(10) Patent No.: US 7,291,904 B2
(45) Date of Patent: Nov. 6, 2007

(54) DOWNSIZED PACKAGE FOR ELECTRIC WAVE DEVICE

(75) Inventors: Takashi Matsuda, Kawasaki (JP);
Suguru Warashina, Kawasaki (JP);
Masanori Ueda, Yokohama (JP);
Osamu Kawachi, Yokohama (JP);
Yasufumi Kaneda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/115,253

(22) Filed: Apr. 27, 2005

(65) Prior Publication Data

US 2005/0242420 A1 Nov. 3, 2005

(30) Foreign Application Priority Data

Apr. 28, 2004 (JP) .............................. 2004-132513

(51) Int. Cl.
*H01L 23/02* (2006.01)
*H01L 23/06* (2006.01)
*H01L 23/48* (2006.01)
*H01L 23/52* (2006.01)
*H03H 9/10* (2006.01)

(52) U.S. Cl. .............................. 257/684; 257/E31.127; 257/E23.061; 257/E23.193; 257/728; 257/688; 257/774; 257/773; 257/700; 257/701; 257/703; 257/758; 257/778; 257/776; 257/414

(58) Field of Classification Search ........ 257/E31.127, 257/E23.061, E23.193, 728, 668, 773, 774, 257/700, 701, 703, 758, 760, 775, 776, 684, 257/414, 737, 100, 448; 29/25.35, 832, 840; 361/56, 776
See application file for complete search history.

(56) References Cited

U.S. PATENT DOCUMENTS

| | | | | |
|---|---|---|---|---|
| 4,069,507 A * | 1/1978 | Defranould et al. | ........ | 348/198 |
| 5,801,474 A * | 9/1998 | Sakairi | ................... | 310/313 R |
| 6,670,868 B2 * | 12/2003 | Kawase et al. | ............. | 333/193 |
| 6,943,447 B2 * | 9/2005 | Ishizuki et al. | ............. | 257/758 |
| 6,972,509 B2 * | 12/2005 | Ikeda et al. | ............. | 310/313 D |
| 2002/0149298 A1 * | 10/2002 | Furukawa et al. | .......... | 310/340 |
| 2003/0000067 A1 * | 1/2003 | Hori | .......................... | 29/592.1 |
| 2004/0075131 A1 * | 4/2004 | Ahn et al. | ................... | 257/306 |
| 2004/0113215 A1 * | 6/2004 | Shimada et al. | ............ | 257/414 |
| 2005/0052724 A1 * | 3/2005 | Suzuki et al. | ................ | 359/305 |

FOREIGN PATENT DOCUMENTS

| | | | | |
|---|---|---|---|---|
| JP | 59-168753 | * | 9/1984 | .................. 375/324 |
| JP | 6-6169 | * | 1/1994 | ............. 310/313 R |
| JP | 2000-77970 | | 3/2000 | |
| JP | 2002-513234 | | 5/2002 | |
| KR | 2003-0007976 | | 1/2003 | |
| WO | 02/087080 A1 | | 10/2002 | |
| WO | 2004/019490 A1 | | 3/2004 | |

* cited by examiner

*Primary Examiner*—Alexander Oscar Williams
(74) *Attorney, Agent, or Firm*—Arent Fox PLLC

(57) ABSTRACT

A package substrate includes signal pads provided on a main surface of the package substrate, footpads provided on a backside of the package substrate, and a sealing electrode provided on the main surface to surround the signal pads, the signal pads being electrically coupled to the footpads, the sealing electrode being insulated from the footpads.

10 Claims, 12 Drawing Sheets

PASSBAND
CHARACTERISTICS

PASSBAND CHARACTERISTICS
(ENLARGED VIEW)

PHASE BALANCE
CHARACTERISTICS

AMPLITUDE BALANCE
CHARACTERISTICS

SURFACE A    SURFACE B    SURFACE C

SURFACE A    SURFACE B    SURFACE C

DOWNSIZED PACKAGE FOR ELECTRIC WAVE DEVICE

BACKGROUND OF THE INVENTION

1. Field of the Invention

This invention generally relates to elastic wave devices and package substrates, and more particularly, to an elastic wave device such as a SAW device or a FBAR device and a package substrate having the elastic wave device thereon.

2. Description of the Related Art

The elastic wave device such as the SAW device or the FBAR device is a small-sized and inexpensive device, and is used in a wide range of applications, for example, a bandpass filter on a mobile telephone. The SAW (Surface Acoustic Wave) device utilizes Rayleigh waves that travel on a surface of an elastic body. The FBAR (Film Bulk Acoustic Resonator) device utilizes vibrations of a piezoelectric film. These elastic wave devices are essential for downsizing communications devices as represented by the mobile telephone, and are demanded to be downsized in order to meet the requirements of further downsized mobile communications terminals in these years.

A size of a substrate is one factor that determines the whole size of the elastic wave device. The size of the substrate denotes the size of the substrate for forming the device before the device is mounted on the package. This size largely depends on the arrangement of excitation electrodes (for exciting the elastic waves) provided on the substrate, the device design such as frequency when used as a device, or the physical characteristics of a material of the substrate having the excitation electrode thereon. For example, the piezoelectric substrate is used for the SAW device. The velocity of the SAW depends almost entirely on the physical characteristics of the piezoelectric substrate. The velocity of the surface wave (v), a gap between the excitation electrodes (period: $\pi$), and the frequency of the device (f) has a relationship denoted by $v=f\times\lambda$. Therefore, the package on which the device is mounted, other than the substrate on which the device is formed, has to be downsized in order to downsize the elastic wave device as a whole.

A description will be given of a structure of the package for the conventional elastic wave device.

FIGS. 1A and 1B illustrate a package structure of the SAW device mounted in a facedown state. FIG. 1A is a bottom view of the piezoelectric substrate mounted on the package. FIG. 1B is a cross-sectional view of the SAW device having the piezoelectric substrate mounted thereon in the facedown state. A bottom surface of a piezoelectric substrate 101 includes a pair of comb-like electrodes 102a (the excitation electrodes) having reflection electrodes 103a and 103b on both sides thereof and another pair of comb-like electrodes 102b (the excitation electrodes) having reflection electrodes 103c and 103d on both sides thereof. The above-mentioned excitation electrodes are respectively connected to signal pads 104a, 104b, and 104c provided on the piezoelectric substrate 101.

Two layers of an upper substrate 105a and a lower substrate 105b are deposited to form the package substrate on the bottom of a package 105. The upper substrate 105a is mounted on the lower substrate 105b on which footpads 106 are formed. The footpads 106 establish electric connection to the outside. A top surface of the upper substrate 105a is a die attach surface 109, and package side signal pads 110 (simply referred to as signal pads) are provided on the die attach surface 109. A stud bump 111 made of gold is provided on the side of the piezoelectric substrate 101, and is connected to the package side signal pad 110.

The piezoelectric substrate 101 is housed in the package 105 in the facedown state so that a main surface having the excitation electrodes thereon may face the die attach surface 109. The signal pads 104a, 104b, and 104c are respectively coupled to the stud bumps 111 by flip-chip bonding so as to connect the corresponding package side signal pads 110. The package side signal pads 110 are coupled to the footpads 106 provided on the lower substrate 105b, which is the backside of the package 105, through an interconnection. An open region of thus configured package 105 is covered with a metal cap 107, and is hermetically sealed with a seal 108. Generally, the seal 108 is heated and melted to hermetically seal the package 105 and the cap 107. The seal 108 employs a solder having a high-melting point, for example, AuSn solder, so as to stand up with a normal reflow temperature. Here, AuSn solder denotes a solder alloy including 80% of Au and 20% of Sn.

A ceramics such as alumina is generally used for the package 105. If alumina ceramics is used for the package 105, an interconnection pattern is printed with the use of tungsten (W) paste, is baked, and is plated with Ni, Au, or both. Generally, the interconnections are thus formed on the upper substrate 105a and the lower substrate 105b.

In these years, a CSP (Chip Size Package) has been developed to further downsize the package for the SAW device. Japanese Patent Application Publication No. 2002-513234 (hereinafter referred to as Document 1) and Japanese Patent Application Publication No. 2000-77970 (hereinafter referred to as Document 2) disclose the package in which the piezoelectric substrate is provided above the plate (also referred to as a mount substrate) serving as a base so as to have a gap between the substrate and the plate, and the circumference of the package is hermetically sealed with a sealing material. The aforementioned package structure requires a highly hermetic sealing material in order to prevent the excitation electrodes provided on the piezoelectric substrate from degrading due to moisture or gas. A metallic material is effective for the sealing material.

FIGS. 2A, 2B, 3A, and 3B illustrate the package structure of the above-mentioned CSP package. FIGS. 2A and 3A are bottom views of piezoelectric substrates mounted on the packages. FIGS. 2B and 3B are cross-sectional views of the SAW devices on which the piezoelectric substrates shown in FIGS. 2A and 3A are mounted in the facedown state. FIG. 4A is a bottom view of an FBAR substrate mounted on the package. FIG. 4B is a cross-sectional view of the FBAR device on which the FBAR substrate shown in FIG. 4A is mounted in the facedown state. Here, the FBAR substrate includes a piezoelectric thin film arranged in a region where the FBAR chip is to be formed. For instance, a piezoelectric thin film layer is provided on a silicon substrate, and the excitation electrodes are formed on the aforementioned piezoelectric thin film layer. In FIGS. 2A through 4B, the same components and configurations as those of FIG. 1 have the same reference numerals. The substrate for the elastic wave device (such as the above-mentioned piezoelectric substrate or the FBAR substrate) collectively denotes the substrate on which the elastic wave device such as the SAW device or FBAR device is formed. The substrate for the elastic wave device has to be distinguished from the package substrate.

In FIGS. 2A through 4B, there are provided a substrate side sealing electrode (referred to as a second sealing electrode) 112, a package side sealing electrode (referred to as first sealing pad or sealing pad) 113, a sealing material 114, and a ground terminal 115. In FIG. 4A, an upper excitation electrode of the FBAR is indicated by reference numeral 116, a lower excitation electrode of the FBAR is indicated by reference numeral 117, and an FBAR substrate is indicated by reference numeral 101'. The SAW device shown in FIGS. 2A and 2B is configured so that the package side sealing electrodes 113 are not coupled to the ground terminal 115. However, the SAW device shown in FIGS. 3A and 3B is configured so that the package side sealing electrodes 113 are coupled to the ground terminal 115 inside the package substrate.

The piezoelectric substrate 101 mounted in the facedown state is, in many cases, configured to employ sheet-shaped substrates for the upper substrate 105a and the lower substrate 105b provided on the bottom of the package 105. In the aforementioned case, several tens to several hundreds of piezoelectric substrates 101 are arranged on the sheet-shaped substrate, are sealed with the metal cap 107, and are diced into the respective elastic wave devices from a side of the sheet-shaped substrates.

The CSP has a structure that normally employs the paste printing or metal plating so as to form the sealing material on the side of the package with a metallic material. When the paste printing is employed, the pattern having a narrow line width cannot be formed without downsizing the grain diameter of the paste. Moreover, a highly accurate positioning is required. Generally, the grain diameter of the paste used for the paste printing has to be approximately ⅓ to ⅕ of the line width of the pattern. However, the currently available technique is just capable of decreasing the grain diameter of the paste to approximately 15 µm. This results in a printable line width of 45 to 75 µm at most. As described above, the package size of the elastic wave device is demanded to be downsized so that the elastic wave device can be downsized as a whole. For this purpose, the package side sealing electrodes 113 have to be narrowed; however, the above-mentioned line width is not enough.

On the other hand, when the metal plating is employed for forming the sealing material, a mask formed by a photo litho process is used. With this mask, the fine processing can be performed easily. It is thus easy to narrow the line widths of the package side seal electrodes. It is to be noted that a series of photo litho process includes multistage processes of resist coating, baking, exposure (mask forming), development, baking, plating, and resist removal. This requires time and cost. Moreover, the package substrate employs the alumina ceramics or glass ceramics that expands and contracts, the contraction percentage differs depending on the package substrates to be used. There arises a problem in that the positioning is misaligned in the mask forming process and the pattern is also misaligned.

SUMMARY OF THE INVENTION

The present invention has been made in view of the above circumstances to provide a technique that can downsize a package for an elastic wave device and simplify the production process.

A more specific object of the present invention is to provide another technique for plating a sealing electrode provided on a side of the package other than a photo litho process.

According to an aspect of the present invention, preferably, there is provided a package substrate including: signal pads provided on a main surface of the package substrate; footpads provided on a backside of the package substrate; and a sealing electrode provided on the main surface to surround the signal pads, the signal pads being electrically coupled to the footpads, the sealing electrode being insulated from the footpads.

According to another aspect of the present invention, preferably, there is provided an elastic wave device including: a device substrate on which excitation electrodes for exciting an elastic wave are mounted thereon; and a package substrate comprising: signal pads provided on a main surface of the package substrate; footpads provided on a backside of the package substrate; and a first sealing electrode provided on the main surface to surround the package side signal pads, the signal pads being electrically coupled to the footpads, the first sealing electrode being insulated from the footpads, a main surface of the device substrate being arranged to face the main surface of the package substrate, a second sealing electrode provided on the main surface of the device substrate and the first sealing electrode being in touch to hermetically seal the elastic wave device.

According to another aspect of the present invention, preferably, there is provided a method for fabricating a package substrate including: forming at least one set of a signal pad provided on a main surface of the package substrate, a sealing electrode provided on the main surface to surround the signal pad, and a footpad electrically coupled to the signal pad, the footpad being provided on a backside of the package substrate while being insulated from the sealing electrode; forming a single extraction electrode for surrounding at least said one set in a circumferential region on a main surface of the package substrate; separating the single extraction electrode into a first electrode and a second electrode, the first electrode being electrically coupled to the signal pad, the second electrode being electrically coupled to the sealing electrode; and passing a current to the second electrode for electrolytically plating the sealing electrode only.

The package substrate of the present invention includes two extraction electrodes for plating. The comb-like electrode (and the pattern electrically coupled thereto) and the sealing electrode (and the pattern electrically coupled thereto) may be electrically separate. It is thus possible to plate the comb-like electrode and the sealing electrode independently. This can make it possible to downsize the package for the elastic wave device and simplify the production process.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

An elastic device of the present invention will be described as a SAW device, in the following description. Other elastic devices such as a FBAR can also be downsized in accordance with advantageous effects of the present invention.

First Embodiment

Figure 1A:
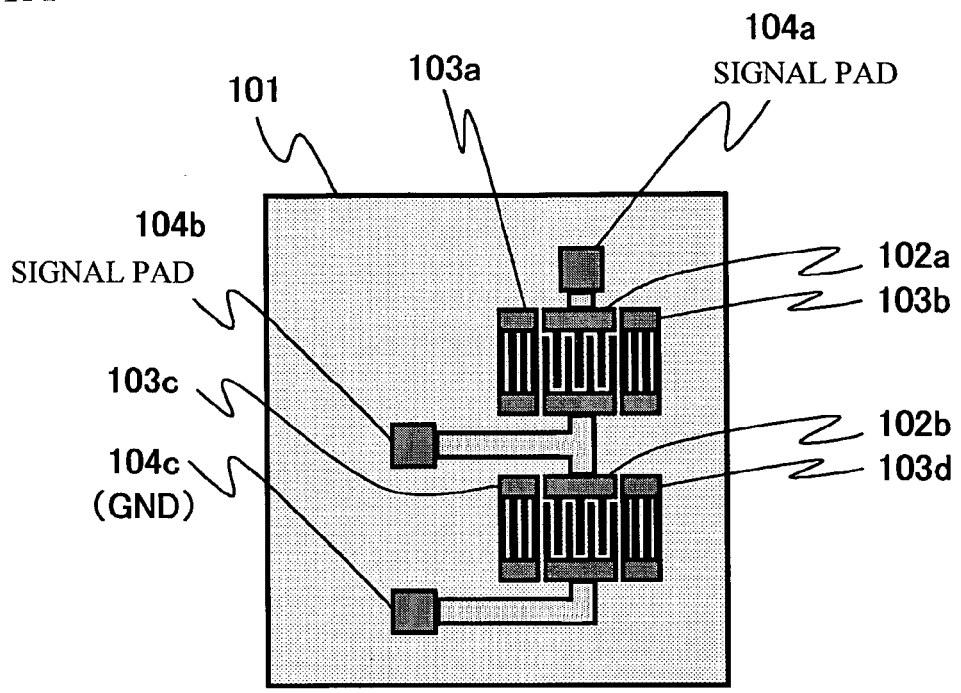
FIGS. 1A and 1B illustrate a package structure of the SAW device mounted in a facedown state.
Figure 1B:
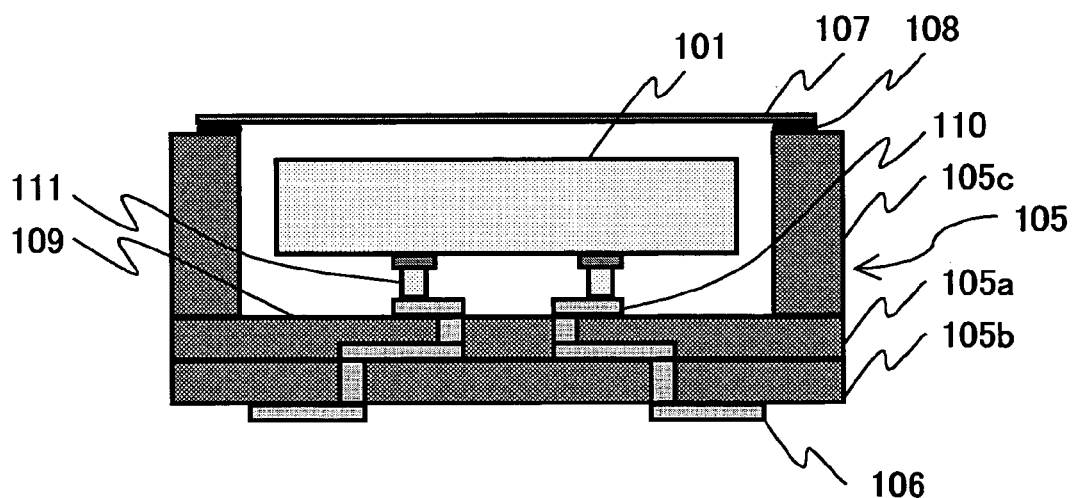
Figure 2A:
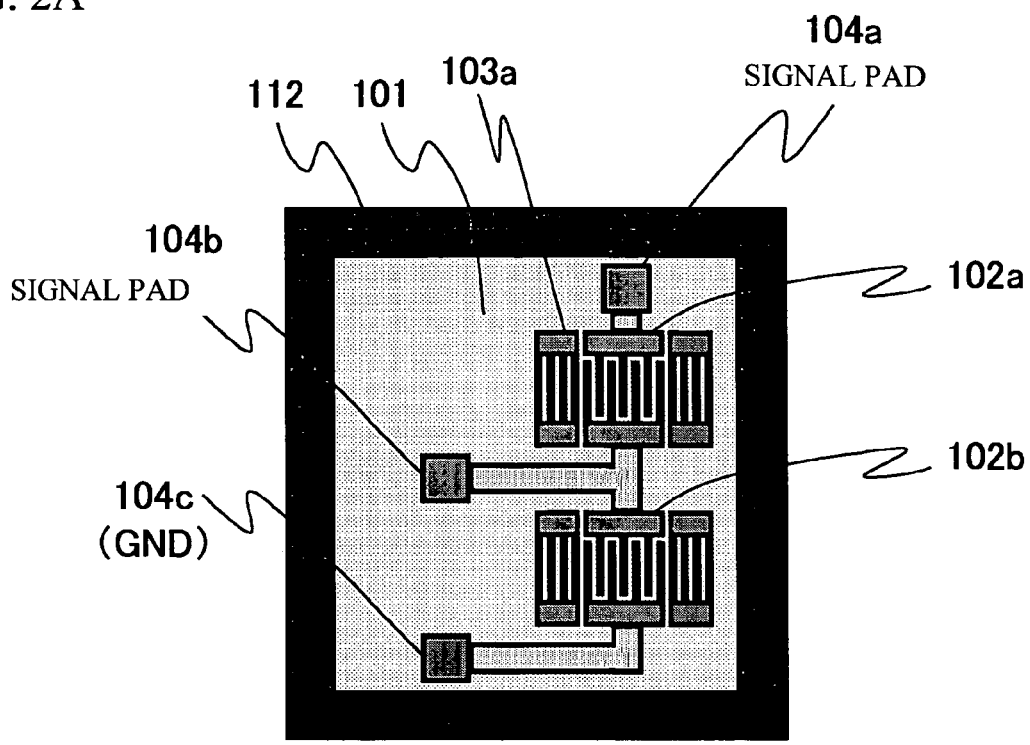
FIGS. 2A and 2B illustrate a first package structure of a CSP package.
Figure 2B:
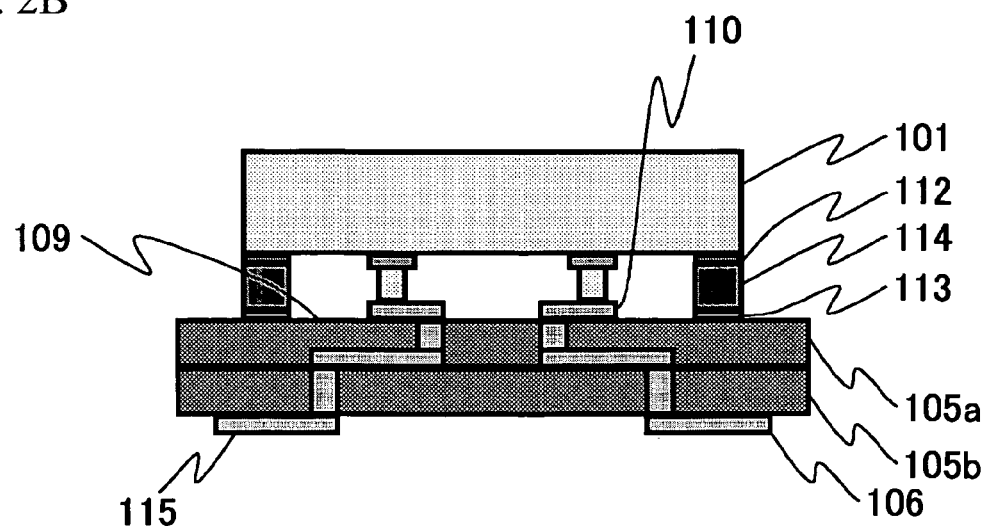
Figure 3A:
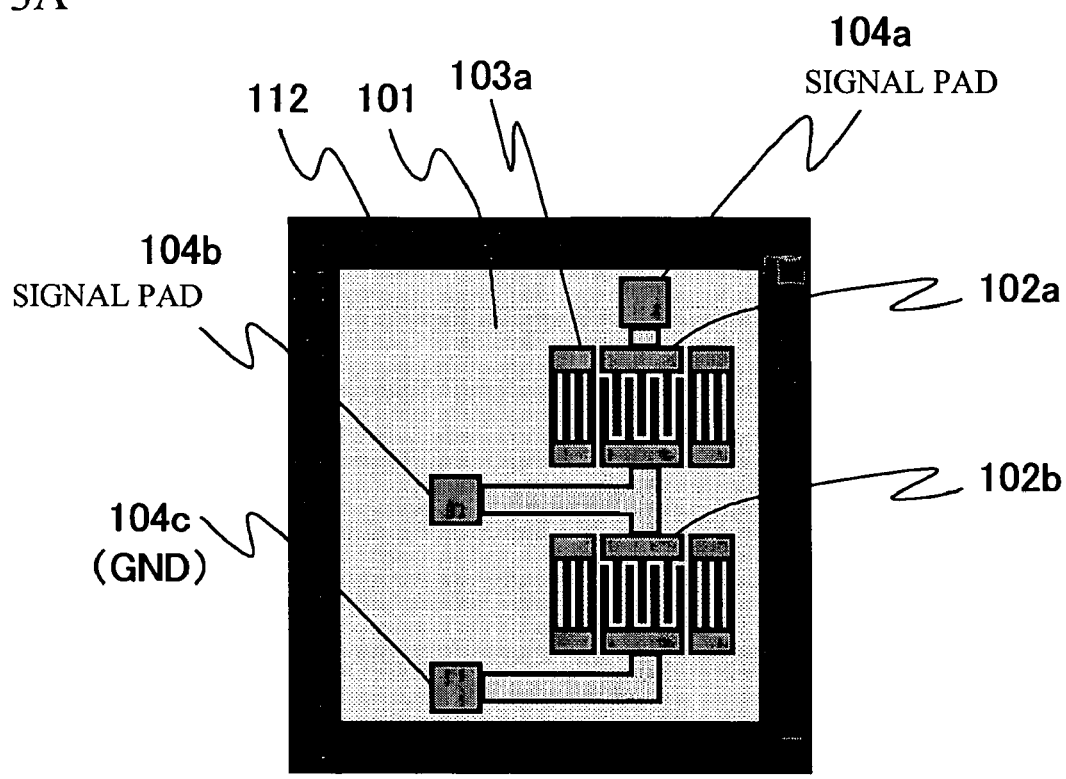
FIGS. 3A and 3B illustrate a second package structure of the CSP package.
Figure 3B:
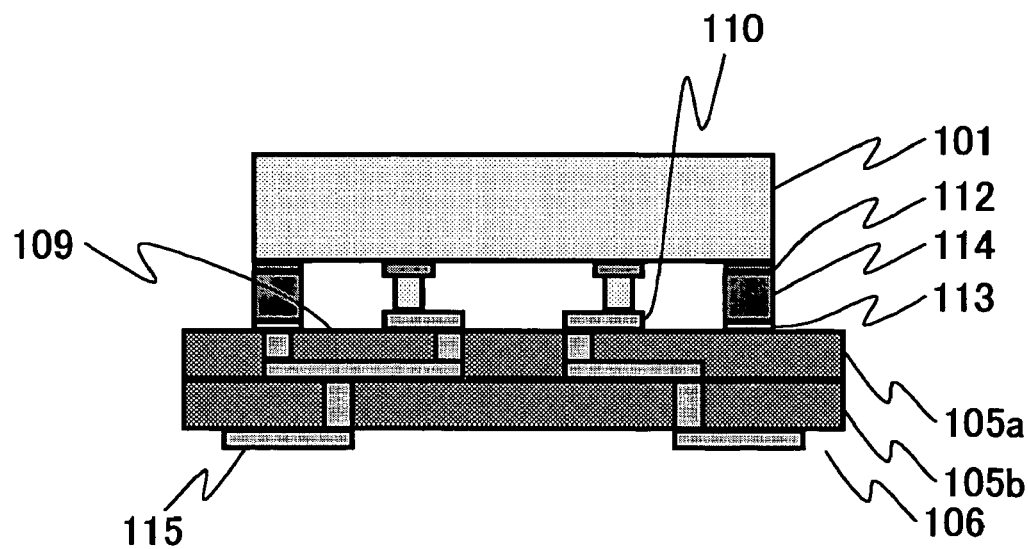
Figure 4A:
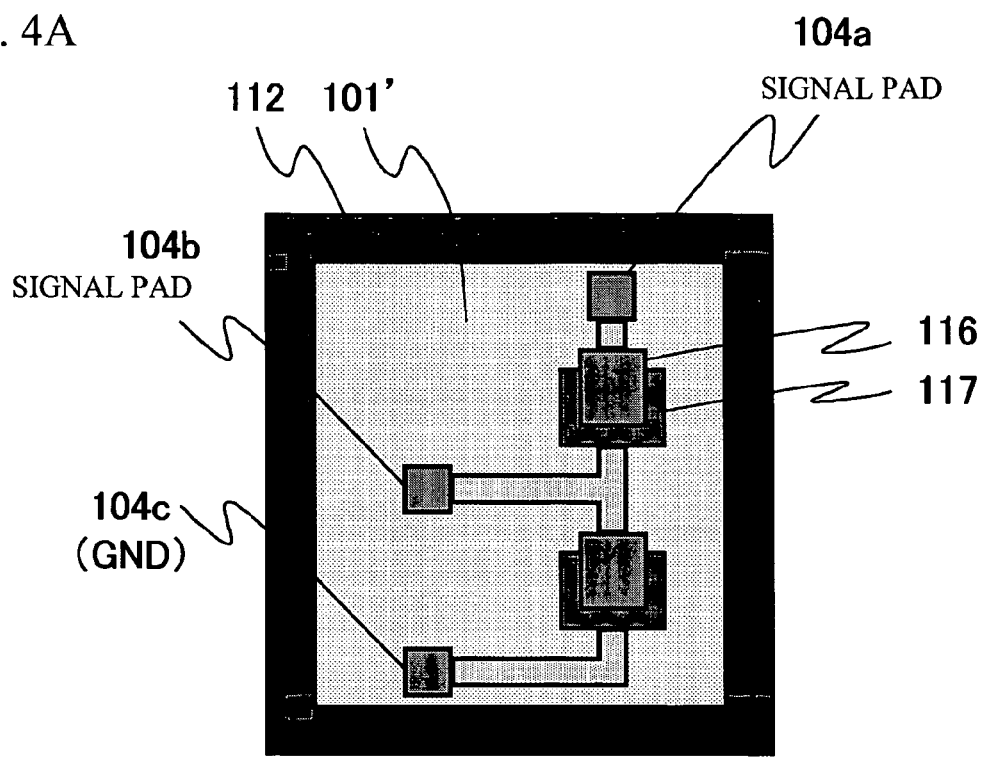
FIG. 4A is a bottom view of an FBAR substrate mounted on the package.
Figure 4B:
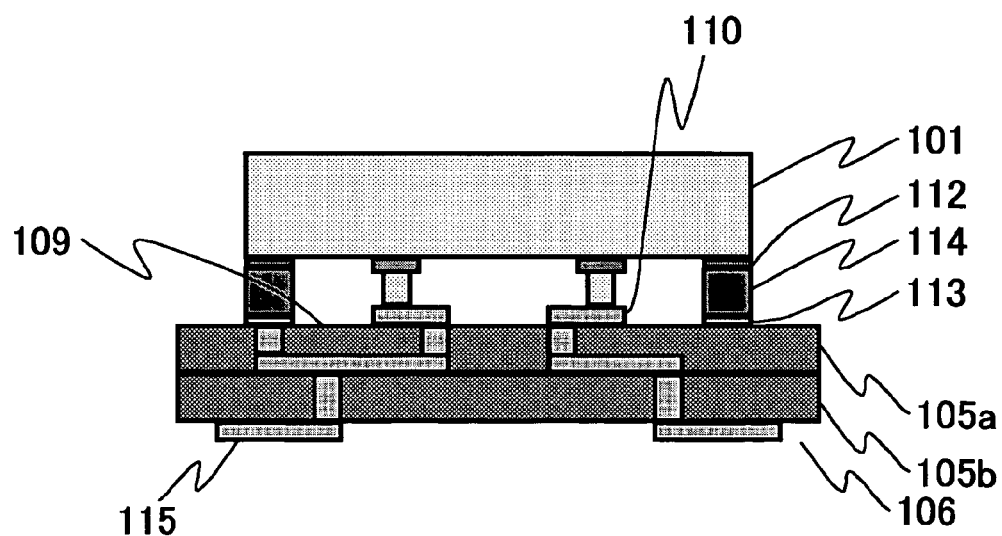
FIG. 4B is a cross-sectional view of the FBAR device on which the FBAR substrate shown in FIG. 4A is mounted.
Figure 5:
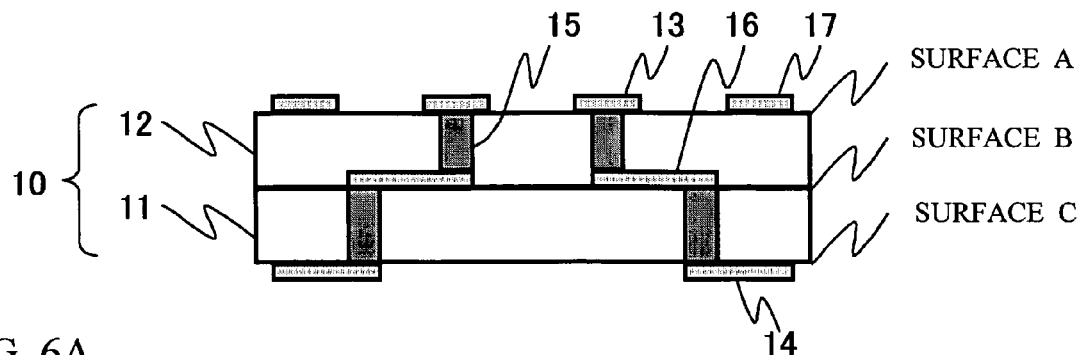
FIG. 5 is a cross-sectional view of the structure of the package substrate in accordance with a first embodiment of the present invention.
Figure 6A:
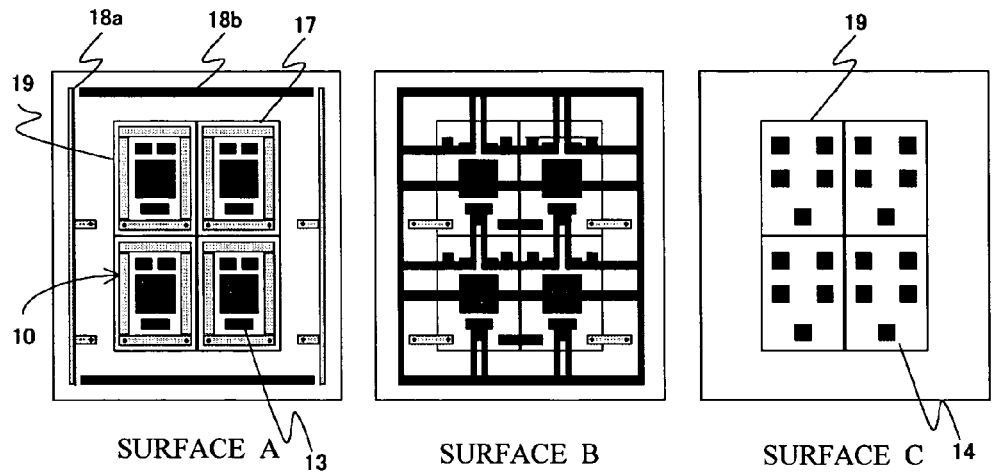
FIGS. 6A and 6B are plain views of the package substrate in accordance with the first embodiment of the present invention.
Figure 6B:
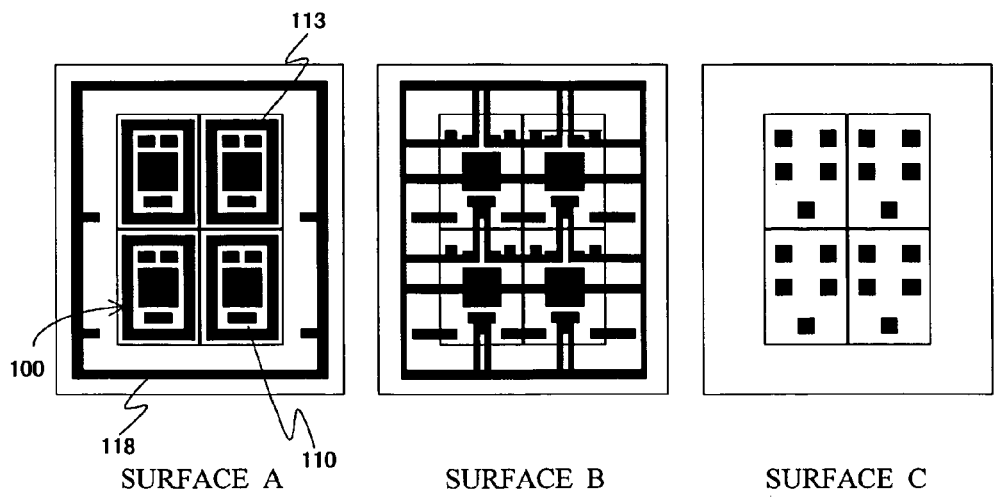

FIG. 5 and FIGS. 6A and 6B illustrate a first structural example of a package substrate of the present invention. FIG. 5 is a cross-sectional view of a structure of the package substrate. FIG. 6A is a plain view of the package substrate of the present invention. FIG. 6B is a plain view of the package substrate for the conventional CSP for comparison.

Referring to FIG. 5, a package substrate 10 is a laminated body of two ceramic sheets, which are a lower substrate 11 and an upper substrate 12. A top surface of the upper substrate 12 is a die attach surface, which is shown in a surface A in FIG. 5. A rear surface of the lower substrate 11 is a footpad surface, which is shown in a surface C in FIG. 5, on which footpads 14 are provided. Vias 15 are respectively provided on the upper substrate 12 and the lower substrate 11. The upper substrate 12 and the lower substrate 11 are bonded together by bonding the respective surfaces B of the substrates. The vias 15 provided on the respective substrates are connected by interconnections 16. Package side signal pads (electrode pads for connecting comb-like electrodes) 13 provided on the upper substrate 12 are electrically coupled to the footpads 14 provided on the lower substrate 11. Sealing electrode (package side sealing electrode) 17, which will be described later, is provided in the vicinity of the circumference of the upper substrate 12.

Referring to FIG. 6A, four package substrates 10 are formed on a single ceramic sheet shown in FIG. 5 before dicing. Two extraction electrodes for plating (an extraction electrode for plating 18a and another extraction electrode for plating 18b) are arranged in a circumferential region so as to surround the package substrates 10. The extraction electrode for plating 18a is connected to the sealing electrode 17 and an interconnection pattern. The interconnection pattern is electrically coupled to the sealing electrode 17, and is shown as the same hatching as the sealing electrode 17. The extraction electrode for plating 18b is connected to electrode pads 13 and a pattern. The pattern is electrically coupled to the electrode pads 13, and is shown in the same hatching as the electrode pads 13. The extraction electrode for plating 18a and the extraction electrode for plating 18b are provided so that the electrode pads 13 for connecting comb-like electrode (and the pattern electrically coupled thereto) may be electrically separate from the sealing electrode 17 (and the pattern electrically coupled thereto). In particular, the sealing electrode 17 is electrically isolated from all the footpads 14 provided on the lower substrate 11 of the package substrate 10. A dicing line 19 is a vertical line to dice the single ceramic sheet into the respective chips, and is not provided as an actual pattern.

Referring to FIG. 6B, the conventional package substrate includes a single extraction electrode for plating 118, which is arranged in the circumferential region of the ceramic sheet so as to surround four package substrates 100 before dicing. Electrodes for connecting comb-like electrodes 110 (and the pattern electrically coupled thereto) and the seal electrodes 113 (and the pattern electrically coupled thereto) are electrically coupled via the extraction electrodes for plating 118.

If an alumina sheet is employed instead of the ceramic sheet, the electrode pads 13 and the sealing electrode 17 are pattern printed with a tungsten (W) paste. The pattern is baked and then plated with a metal such as Ni or Au. This plating is electrolytic plating, and only a region conducting in the plating process is selectively plated.

As shown in FIG. 6B, the electrolytic plating is performed while the electrodes for connecting comb-like electrodes 110 (and the pattern electrically coupled thereto) and the sealing electrode 17 (and the pattern coupled thereto) are electrically coupled via the extraction electrodes for plating 118, and a current passes through the extraction electrodes for plating 118 provided on the die attach surface of the surface A. This results in the overall plating of the electrodes in contact with a plating solution, except for the surface B that is a bonded surface of the two package substrates. In other words, the overall electrodes provided on the surfaces A and C are plated. An area except for the sealing electrode 113 has to be masked with a photo resist and the electrolytic plating has to be performed again in order to selectively plate the sealing electrode 113 provided on the surface A. An additional photo litho process is required in the aforementioned plating process, and it is disadvantageous in view of cost.

Figure 7:
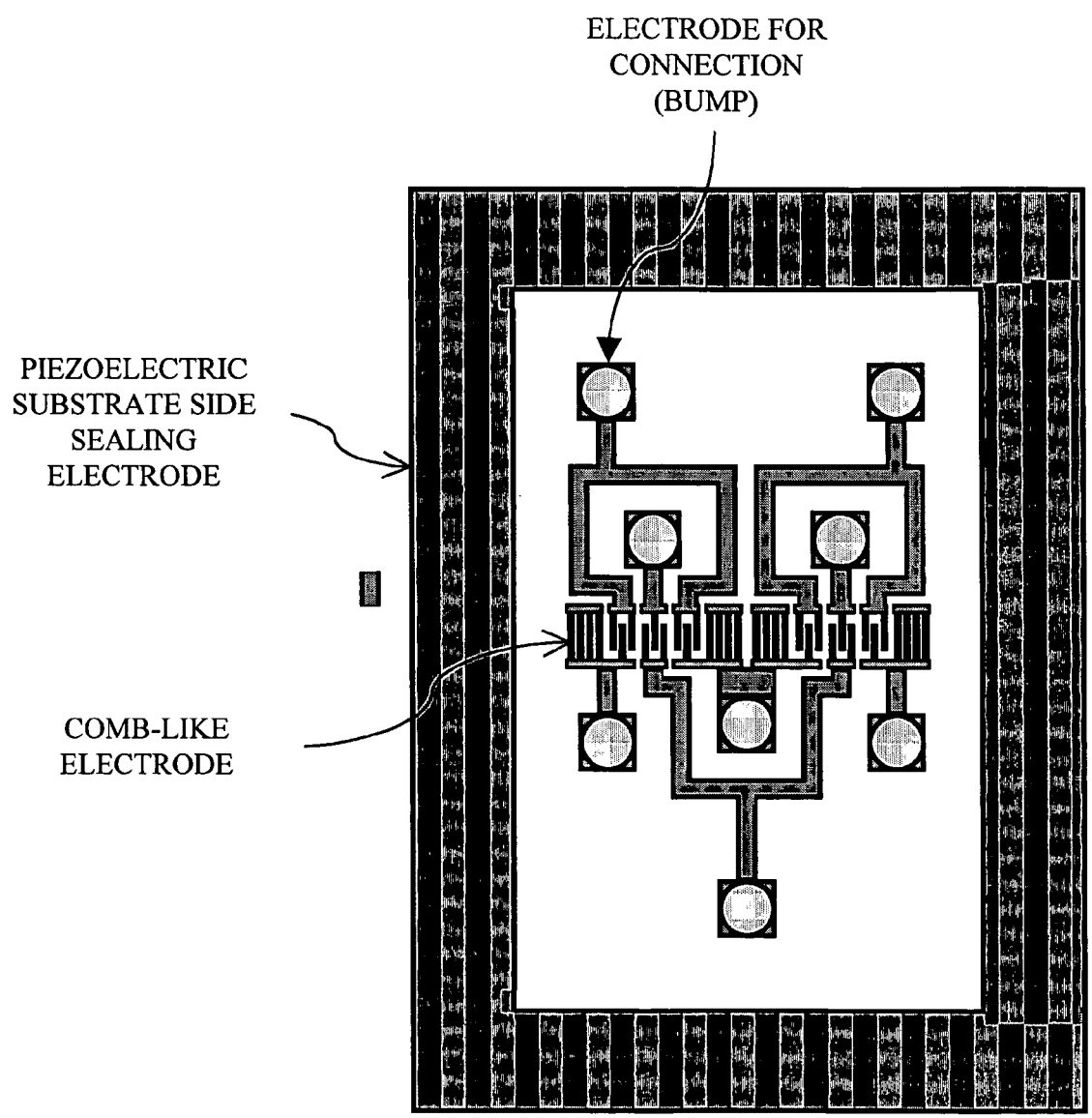
FIG. 7 shows an example of a SAW filter mounted on the package substrate of the present invention.

In contrast, the package substrate of the present invention is configured to include the two extraction electrodes 18a and 18b and make the electrode pads 13 for connecting comb-like electrode (and the pattern electrically connected thereto) electrically separate from the sealing electrode 17 (and the pattern electrically connected thereto). It is thus possible to plate the electrode pads 13 and the sealing electrode 17 separately and independently. Therefore, the additional photo litho process in not required for providing the sealing material onto the sealing electrode 17. The sealing electrode 17 is plated as described above, and the ceramic sheet is diced into the individual package substrates 10. A piezoelectric substrate having a piezoelectric substrate side sealing electrode thereon shown in FIG. 7 is mounted on the package substrate 10, and a SAW filter is produced. The elastic wave device of the present invention is thus obtained.

The aforementioned piezoelectric substrate is mounted on the package substrate to produce the CSP shown in FIGS. 2A through 4B. That is to say, the piezoelectric substrate surface having the excitation electrodes for the elastic waves thereon are made to face the die attach surface of the package substrate. The aforementioned substrates are bonded together to form a gap between the upper surface of the excitation electrodes and the die attach surface of the package substrate. The sealing material is provided so as to hermetically seal the gap between the upper surface of the excitation electrodes and the die attach surface of the package substrate. In addition, the excitation electrodes provided on the piezoelectric substrate are connected to signal pads provided on the die attach surface of the package substrate through the stud bumps. A signal is supplied from the footpad provided on the backside of the package substrate, and is supplied to the excitation electrode on the piezoelectric substrate. Thus, the elastic wave device operates.

The SAW device has been described as the elastic wave device in order to facilitate the better understanding of the present invention. However, the elastic wave device is not limited to the SAW device, and the FBAR device may be applied. When the elastic wave device is formed on the piezoelectric material, the elastic wave device is not necessarily formed on the piezoelectric substrate directly. The comb-like electrodes may be provided on the piezoelectric thin film formed on the substrate so as to form the elastic wave device.

Second Embodiment

Figure 8A:
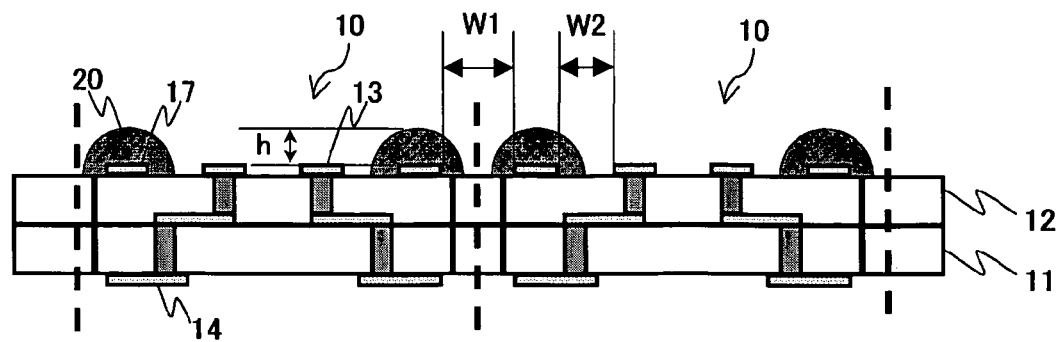
FIGS. 8A and 8B are views of a package substrate in accordance with a second embodiment of the present invention.
Figure 8B:
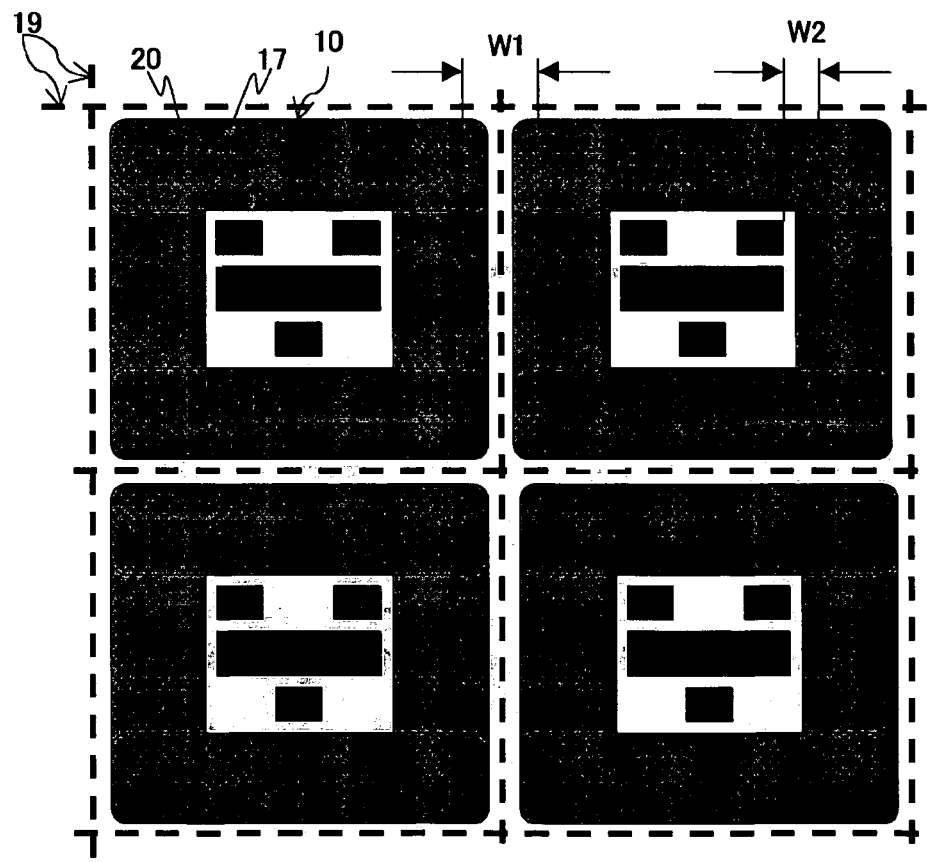

FIGS. 8A and 8B illustrate a second structural example of a package substrate of the present invention. FIG. 8A is a cross-sectional view of the package substrate of the present invention. FIG. 8B is a top view of the die attach surface of the package substrate.

The present invention does not use a mask for plating the sealing electrode 17 provided on the package substrate 10 with a metal seal, as described above. The sealing electrode 17 is selectively plated with the electrolytic plating by conducting the sealing electrode 17 only. It is to be noted that if the plating is performed without a mask, the plating isotropically proceeds on the sealing electrode 17, resulting in the sealing material having a semi-cylindrical shape that coats and overflows from the sealing electrode 17. If the aforementioned sealing material having the semi-cylindrical shape is formed on the sealing electrode 17, there arises a drawback easily in that the sealing electrode 17 in regions adjacently arranged to each other on the package substrate 10 before dicing may be short-circuited, or the sealing electrode 17 and the electrode pad 13 may be short-circuited.

Therefore, the package substrate is configured to satisfy the following expression in order to avoid the above-mentioned drawback, in accordance with the second embodiment of the present invention. Here, h denotes a plating height (a difference between the highest point of the sealing material 20 and the top surface of the electrode pad 13 for connecting comb-like electrodes), W1 denotes a distance between closest sealing electrode 17 provided on the adjacently arranged package substrates 10, W2 denotes a distance between the sealing electrode 17 and the most closely arranged electrode pad 13 provided on the same package substrate 10. The distance W1 is equal to or more than 2.5 times of the plating height ($W1 \geq 2.5 h$). The distance W2 is equal to or more than 1.5 times of the plating height ($W2 \geq 1.5 h$). The aforementioned arrangement of the electrodes and the plating conditions with the use of the sealing material 20 are capable of avoiding the short-circuit between the sealing electrode 17 provided on the adjacently arranged package substrates 10 or between the electrode pad 13 and the sealing electrode 17. The SAW filter or the like is mounted on the package substrate 10 and the elastic wave device of the present invention is thus obtained.

Third Embodiment

Figure 9A:
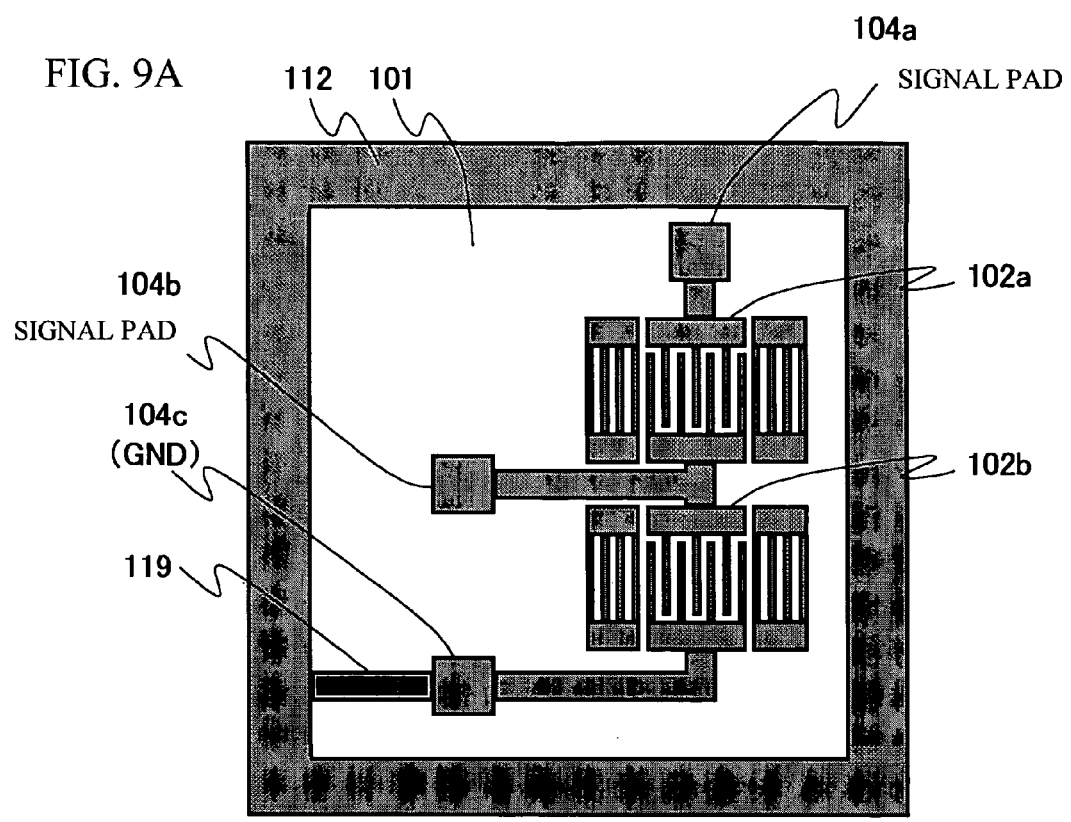
FIGS. 9A and 9B are views of a package substrate in accordance with a third embodiment of the present invention.
Figure 9B:
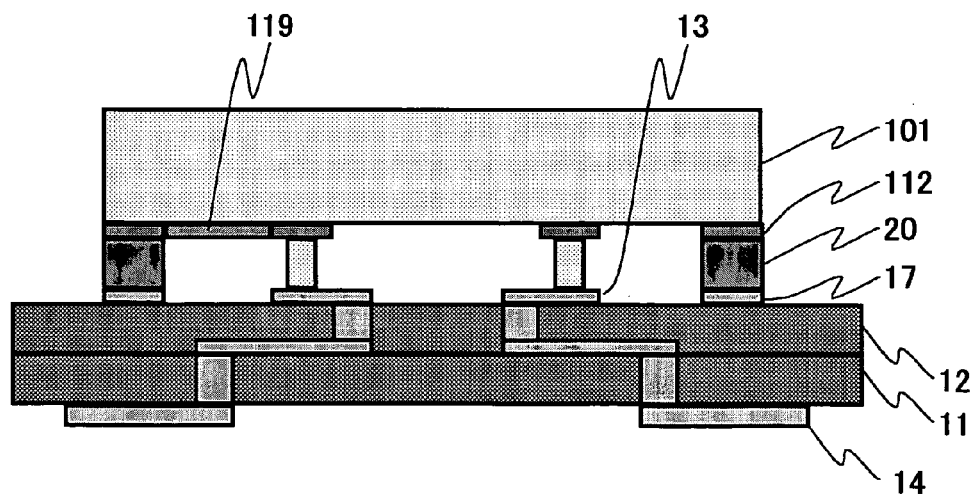

FIGS. 9A and 9B illustrate a third structural example of a package substrate of the present invention. FIG. 9A is a cross-sectional view of the main surface of the piezoelectric substrate mounted on the package substrate of the present invention. FIG. 9B is a cross-sectional view illustrating the elastic wave device mounted on the package substrate.

An electrode 119 is provided for connecting the signal pads 104c and a piezoelectric substrate side sealing electrode 112 on the piezoelectric substrate 101, in accordance with a third embodiment of the present invention. The piezoelectric substrate side sealing electrode 112 is grounded to reduce stray capacitance. In FIGS. 9A and 9B, the same components and configurations as those of the FIGS. 1A through 4B have the same reference numerals. It is effective for selecting a material that has a bad "wettability" with the sealing material so as to prevent the sealing material flowing into the comb-like electrodes through the electrode 119. Preferably, the electrode material is chromium (Cr) or aluminum (Al) when SnAg alloy solder is employed as the sealing material.

Fourth Embodiment

Figure 10A:
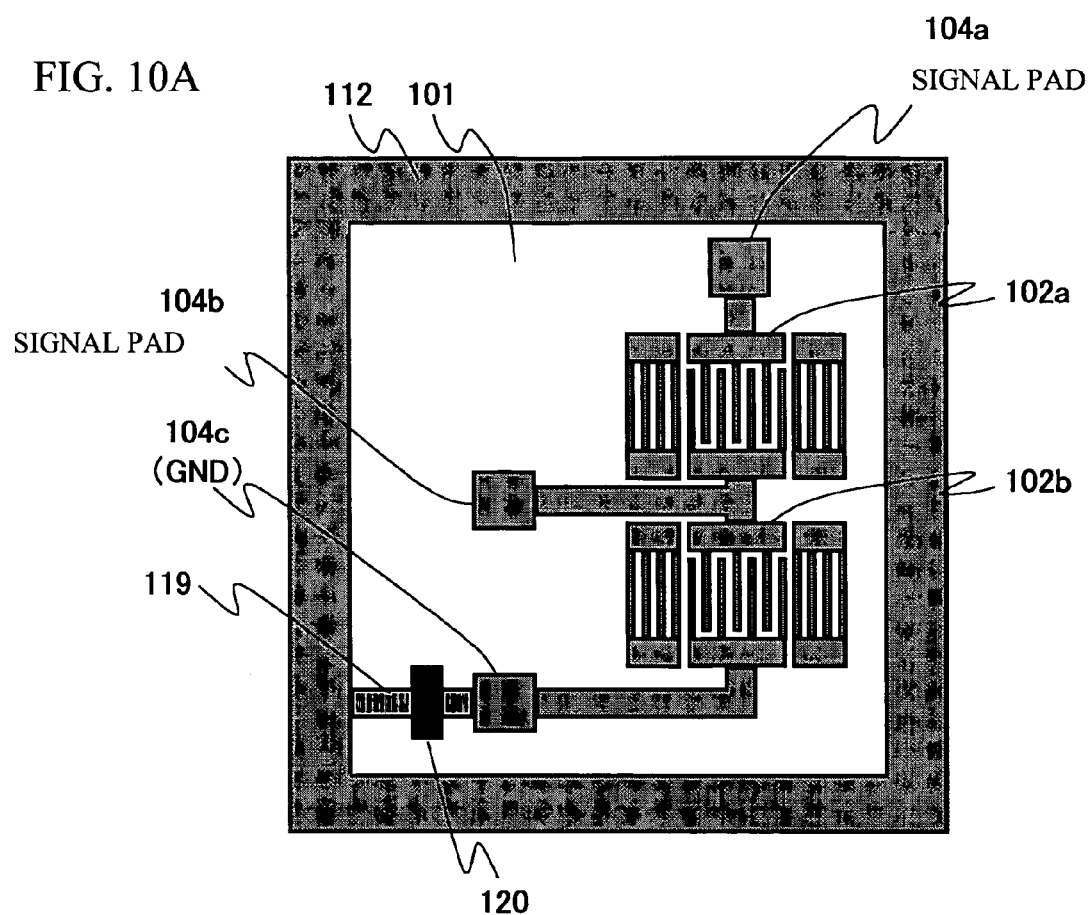
FIGS. 10A and 10B are views of a package substrate in accordance with a fourth embodiment of the present invention.
Figure 10B:
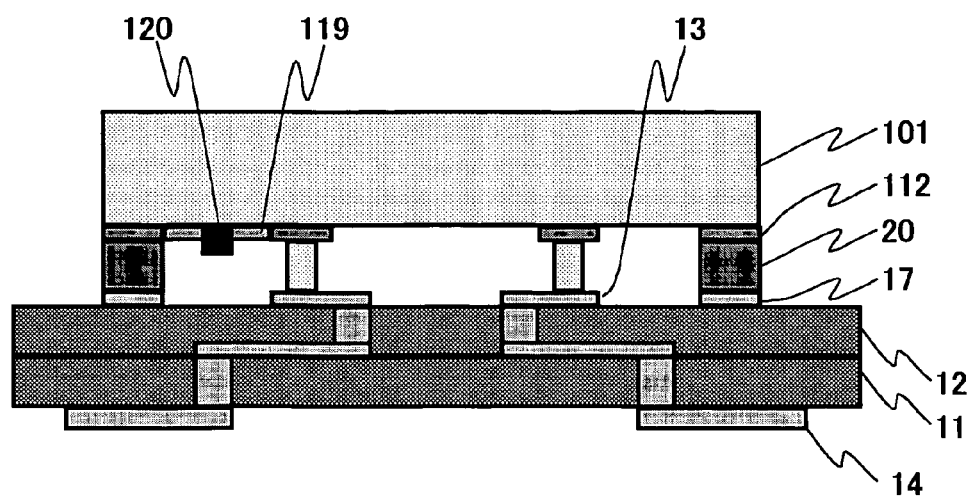

FIGS. 10A and 10B illustrate a fourth embodiment of the present invention. FIG. 10A illustrates a main surface of the piezoelectric substrate mounted on the package substrate. FIG. 10B is a cross-sectional view of the elastic wave device mounted on the package substrate.

An oxide ($SiO_2$) film 120 is arranged in at least one region of the electrode 119 that connects the signal pads 104c and the piezoelectric substrate side sealing electrode 112. Thus arranged oxide film 120 worsens the flow of solder, and can prevent the sealing material from flowing into the comb-like electrodes. The oxide film is not always necessary for achieving this purpose. Another material may be employed unless the material gets wet with the sealing material.

Fifth Embodiment

Figure 11A:
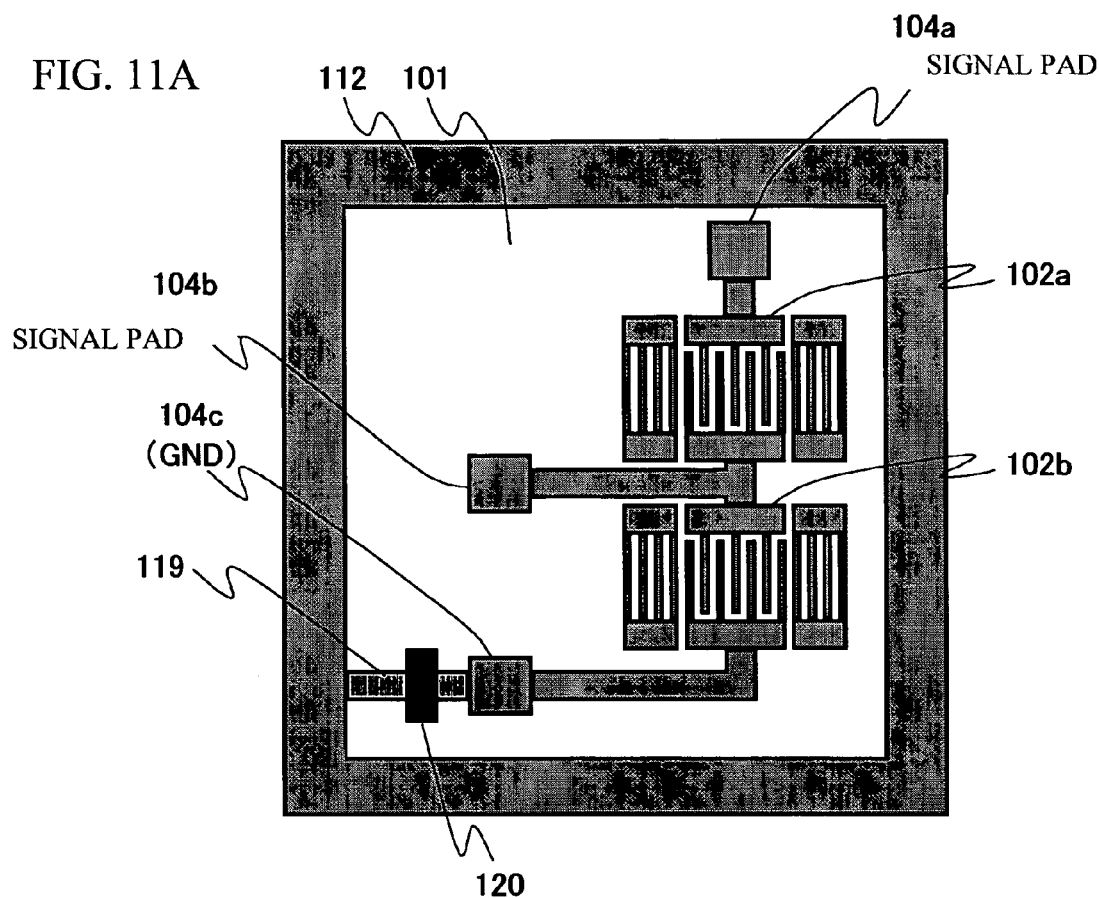
FIGS. 11A and 11B are views of a package substrate in accordance with a fifth embodiment of the present invention.
Figure 11B:
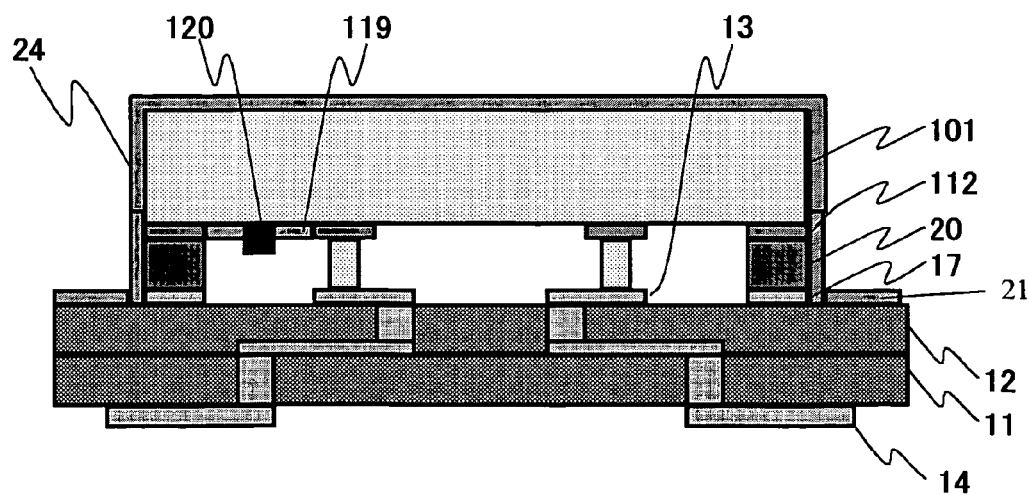

FIGS. 11A and 11B illustrate a fifth embodiment of the present invention. FIG. 11A illustrates a main surface of the piezoelectric substrate mounted on the package substrate. FIG. 11B is a cross-sectional view of the elastic wave device mounted on the package substrate.

A conductive resin is partially coated on an outer surface of the elastic wave device shown in FIG. 10B in accordance with the fifth embodiment of the present invention. A conductive resin 21 is coated on a reverse surface (backside) of the main surface (on which the comb-like electrodes are provided) of the piezoelectric substrate 101. The conductive resin 21 is also coated on a sidewall and in the vicinity of the upper electrode 12 included in the package substrate 10. The backside of the piezoelectric substrate 101 is grounded.

Figure 12A:
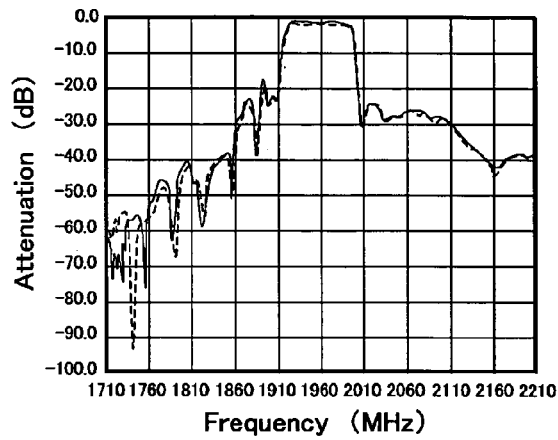
FIGS. 12A and 12B show passband characteristics.
Figure 12B:
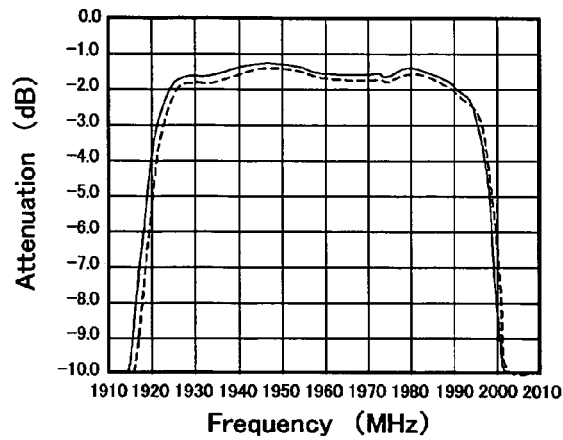
Figure 12C:
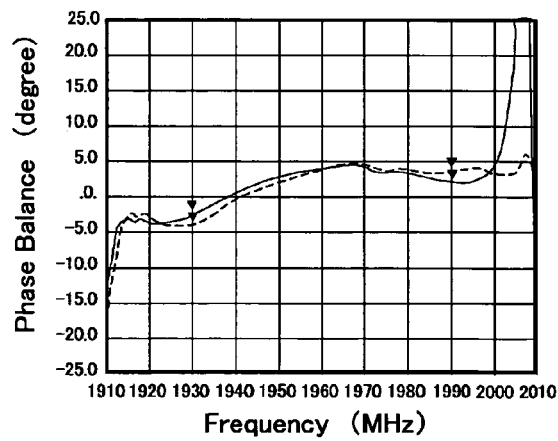
FIGS. 12C and 12D show balance characteristics.
Figure 12D:
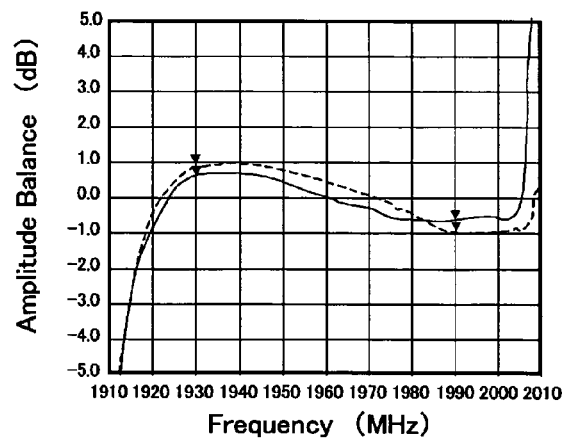

FIGS. 12A through 12D are graphs showing device characteristics of the SAW filter having the configuration shown in FIGS. 11A and 11B. FIGS. 12A through 12D also show the device characteristics of the SAW filter having the configuration shown in FIGS. 10A and 10B, for comparison. FIG. 12A shows passband characteristics. FIG. 12B also shows passband characteristics (enlarged view of the passband). FIG. 12C shows phase balance characteristics. FIG. 12D shows amplitude balance characteristics. Those characteristics are based on the specifications on the receive filter of the PCS system (balance specification) established in the United States.

The comparison between the two device characteristics indicates that both of the passband characteristics and the balance characteristics are improved, by connecting the backside of the piezoelectric substrate to the ground in accordance with the fifth embodiment of the present invention.

Sixth Embodiment

Figure 13A:
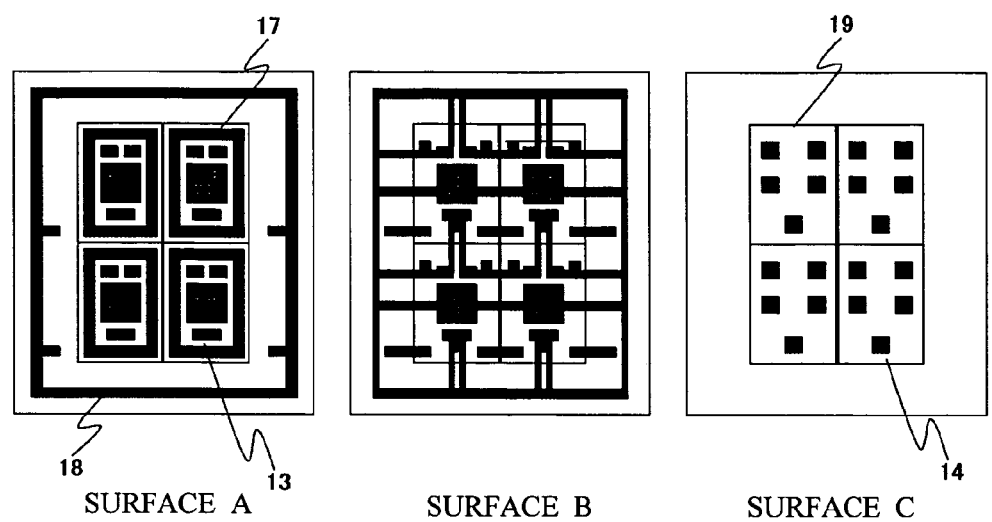
FIGS. 13A and 13B are views of a package substrate in accordance with a sixth embodiment of the present invention.
Figure 13B:
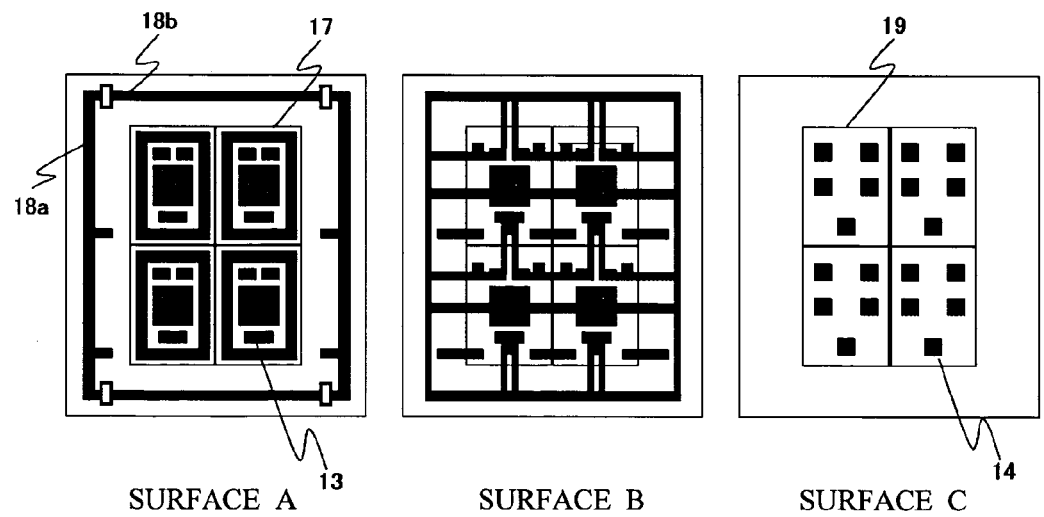

FIGS. 13A and 13B illustrate a sixth embodiment of the present invention. FIG. 13A is a view illustrating a surface of the package substrate before the sealing material is plated. FIG. 13B is a view illustrating the surface of the package substrate in which the extraction electrode is partially cut out.

The extraction electrode for plating 18 has the same configuration as FIG. 6B. The extraction electrode is partially cut out for plating the sealing material. Four places are cut out in FIG. 13B. FIG. 13B substantially has the same layout as that of FIG. 6A by cutting out the four places. That is to say, the electrode pads 13 for connecting comb-like electrodes (and the pattern electrically coupled thereto) are electrically coupled to the sealing electrode (and the pattern electrically coupled thereto) in the original layout of the extraction electrode for plating 18 shown in FIG. 13A. However, the extraction electrode 18 is partially cut out, and then the extraction electrode 18 is divided into the extraction electrode for plating 18a and the extraction electrode for plating 18b. The extraction electrode for plating 18a is connected to the sealing electrode 17 and the pattern electrically coupled thereto. The extraction electrode for plating 18b is connected to the electrode pads 13 and the pattern electrically coupled thereto. The electrode pad 13 and the sealing electrode 17 are plated independently and separately, by partially cutting the extraction electrode 18. No additional photo litho process is required for providing the sealing material 20 onto the sealing electrode 17.

The present invention provides a technique that can plate the package side sealing electrode without the photo litho process and can downsize the package for the elastic wave device and simplify the process. The present invention is effective for producing the SAW device or FBAR device.

The present invention is not limited to the above-mentioned embodiments, and other embodiments, variations and modifications may be made without departing from the scope of the present invention.

The present invention is based on Japanese Patent Application No. 2004-132513 filed on Apr. 28, 2004, the entire disclosure of which is hereby incorporated by reference.

What is claimed is:

1. A package substrate comprising:
signal pads provided on a main surface of the package substrate;
footpads provided on a backside of the package substrate;
a sealing electrode provided on the main surface to surround the signal pads, the sealing electrode forming a hermetical seal in touch with a corresponding sealing electrode of a device to be packaged in an assembled state, wherein the signal pads are electrically coupled to the footpads, and the sealing electrode is insulated from the footpads; and
a plurality of extraction electrodes including at least a first extraction electrode and a second extraction electrode, wherein:

the package substrate comprises a plurality of sets of the signal pads, the footpads, and the sealing electrodes,
said plurality of sets being respectively provided in a plurality of regions arranged adjacently to each other,
the plurality of extraction electrodes being arranged in a circumferential region of the main surface to surround said plurality of sets,
the first extraction electrode electrically coupled to the signal pads and the second extraction electrode electrically coupled to the sealing electrode,
the signal pads and the sealing electrodes being separately plated through the first and second extraction electrodes which are insulated from each other, respectively.

2. The package substrate as claimed in claim 1, wherein a surface of the sealing electrode is coated with a sealing material, which is electrolytically plated by passing a current to the second extraction electrode.

3. The package substrate as claimed in claim 2, wherein W1 is equal to or greater than 2.5 h and W2 is equal to or greater than 1.5, where the W1 denotes a distance between the sealing electrodes arranged adjacently to each other, the W2 denotes a closest distance between the sealing electrode and the signal pad, and the h denotes a difference between a top of the sealing material and upper surfaces of the signal pads.

4. An elastic wave device comprising:
a device substrate on which excitation electrodes for exciting an elastic wave are mounted; and
a package substrate comprising:
signal pads provided on a main surface of the package substrate;
footpads provided on a backside of the package substrate; and
a first sealing electrode provided on the main surface to surround the package side signal pads,
the signal pads being electrically coupled to the footpads,
the first sealing electrode being insulated from the footpads,
a main surface of the device substrate being arranged to face the main surface of the package substrate,
a second sealing electrode provided on the main surface of the device substrate and the first sealing electrode being in touch to hermetically seal the elastic wave device,
the signal pads and the first sealing electrode being separately plated through first and second extraction electrodes which are insulated from each other and connected to the signal pads and the first sealing electrode, respectively.

5. The elastic wave device as claimed in claim 4, further comprising:
a plurality of signal pads connected to the excitation electrodes provided on the main surface of the device substrate; and
a specific electrode for electrically coupling the sealing electrode and at least one of the plurality of signal pads.

6. The elastic wave device as claimed in claim 5, wherein the specific electrode is made of a material having a low wettability with the sealing electrode.

7. The elastic wave device as claimed in claim 6, wherein the specific electrode is partially coated with the material having the low wettability with the sealing electrode.

8. The elastic wave device as claimed in claim 5, further comprising a conductive portion for electrically coupling a backside of the device substrate and at least one of the plurality of signal pads through the specific electrode.

9. The elastic wave device as claimed in claim 8, wherein the conductive portion is a conductive resin for coating the backside and opposite sides of the device substrate.

10. The elastic wave device as claimed in claim 4, wherein the elastic wave device is one of a SAW device and an FBAR device.

* * * * *